(12) United States Patent
Lin et al.

(10) Patent No.: US 10,930,636 B2
(45) Date of Patent: Feb. 23, 2021

(54) TRANSIENT VOLTAGE SUPPRESSION DEVICE

(71) Applicant: AMAZING MICROELECTRONIC CORP., New Taipei (TW)

(72) Inventors: Kun-Hsien Lin, Hsinchu (TW); Zi-Ping Chen, New Taipei (TW); Che-Hao Chuang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/105,310

(22) Filed: Aug. 20, 2018

(65) Prior Publication Data

US 2020/0058636 A1 Feb. 20, 2020

(51) Int. Cl.
*H01L 27/082* (2006.01)
*H01L 27/102* (2006.01)
(Continued)

(52) U.S. Cl.
CPC ........ *H01L 27/0248* (2013.01); *H01L 27/067* (2013.01); *H01L 27/082* (2013.01);
(Continued)

(58) Field of Classification Search
CPC . H01L 27/067; H01L 27/082; H01L 27/1022; H01L 29/0623; H01L 29/0821; H01L 29/735
(Continued)

(56) References Cited

U.S. PATENT DOCUMENTS 7,875,933 B2 1/2011 Schneider et al.
8,513,774 B2 8/2013 Chen et al.
(Continued)

FOREIGN PATENT DOCUMENTS

CN 106558543 A 4/2017
TW 201112393 A 4/2011
(Continued)

OTHER PUBLICATIONS

Search Report Issued by Foreign Patent Office in Application No. 108124991.
(Continued)

*Primary Examiner* — Kimberly N Rizkallah
*Assistant Examiner* — Dilinh P Nguyen
(74) *Attorney, Agent, or Firm* — Rosenberg, Klein & Lee (57) ABSTRACT

A transient voltage suppression device includes a lightly-doped semiconductor structure, a first doped well, a first heavily-doped area, a first buried area, and a second heavily-doped area. The lightly-doped semiconductor structure has a first conductivity type. The first doped well has a second conductivity type and is formed in the lightly-doped semiconductor structure. The first heavily-doped area has the second conductivity type and is formed in the first doped well. The first buried area has the first conductivity type and is formed in the lightly-doped semiconductor structure and under the first doped well, and the first buried area is adjacent to the first doped well. The second heavily-doped area has the second conductivity type and is formed in the lightly-doped semiconductor structure.

11 Claims, 14 Drawing Sheets

(51) Int. Cl.
- *H01L 29/70* (2006.01)
- *H01L 27/02* (2006.01)
- *H01L 27/06* (2006.01)
- *H01L 29/06* (2006.01)
- *H01L 29/08* (2006.01)
- *H01L 29/735* (2006.01)
- *H02H 9/04* (2006.01)

(52) U.S. Cl.
CPC ...... *H01L 29/0623* (2013.01); *H01L 29/0821* (2013.01); *H01L 29/735* (2013.01); *H02H 9/04* (2013.01)

(58) Field of Classification Search
USPC ......................................................... 257/566
See application file for complete search history.

(56) References Cited

U.S. PATENT DOCUMENTS

| | | |
|---|---|---|
| 2006/0226488 A1 | 10/2006 | Schneider et al. |
| 2012/0139013 A1* | 6/2012 | Bahl .................. H01L 29/7722 257/266 |
| 2012/0267715 A1* | 10/2012 | Chou .................. H01L 29/1045 257/336 |
| 2015/0097269 A1* | 4/2015 | Huang .................... H01L 29/87 257/577 |
| 2015/0221651 A1* | 8/2015 | Toh .................. H01L 27/10802 257/192 |
| 2016/0148921 A1 | 5/2016 | Mallikararjunaswamy et al. |
| 2016/0372591 A1* | 12/2016 | Huang ................ H01L 29/7835 |
| 2018/0082994 A1 | 3/2018 | Han et al. |

FOREIGN PATENT DOCUMENTS

| | | |
|---|---|---|
| TW | 201322424 A | 6/2013 |
| TW | 201436404 A | 9/2014 |

OTHER PUBLICATIONS

Search Report Issued by Foreign Patent Office in Application No. 201811173780.4.

Search Report Issued by Foreign Patent Office in Application No. 10920637760.

* cited by examiner

TRANSIENT VOLTAGE SUPPRESSION DEVICE

BACKGROUND OF THE INVENTION

Field of the Invention

The present invention relates to a suppression device, particularly to a transient voltage suppression device that forms a deeper breakdown junction.

Description of the Related Art

Figure 1:
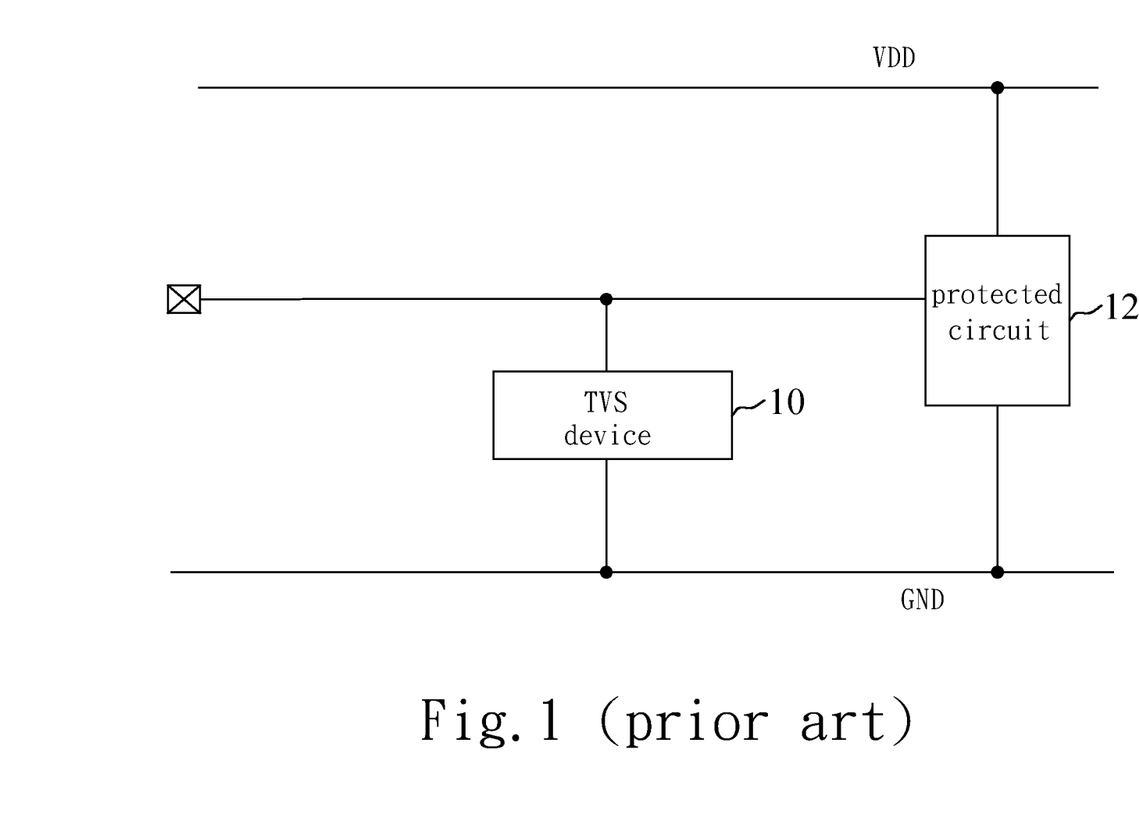
FIG. 1 is a schematic diagram illustrating a transient voltage suppressor (TVS) connected with a protected circuit in the conventional technology.

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages. The working principle of TVS is shown in FIG. 1. In FIG. 1, the TVS device 10 is connected in parallel with the protected circuit 12 on the printed circuit board (PCB). The TVS device 10 would be triggered immediately when the ESD event occurs. In that way, the TVS device 10 can provide a superiorly low resistance path for discharging the transient ESD current, so that the energy of the ESD transient current can be bypassed by the TVS device 10.

Figure 2:
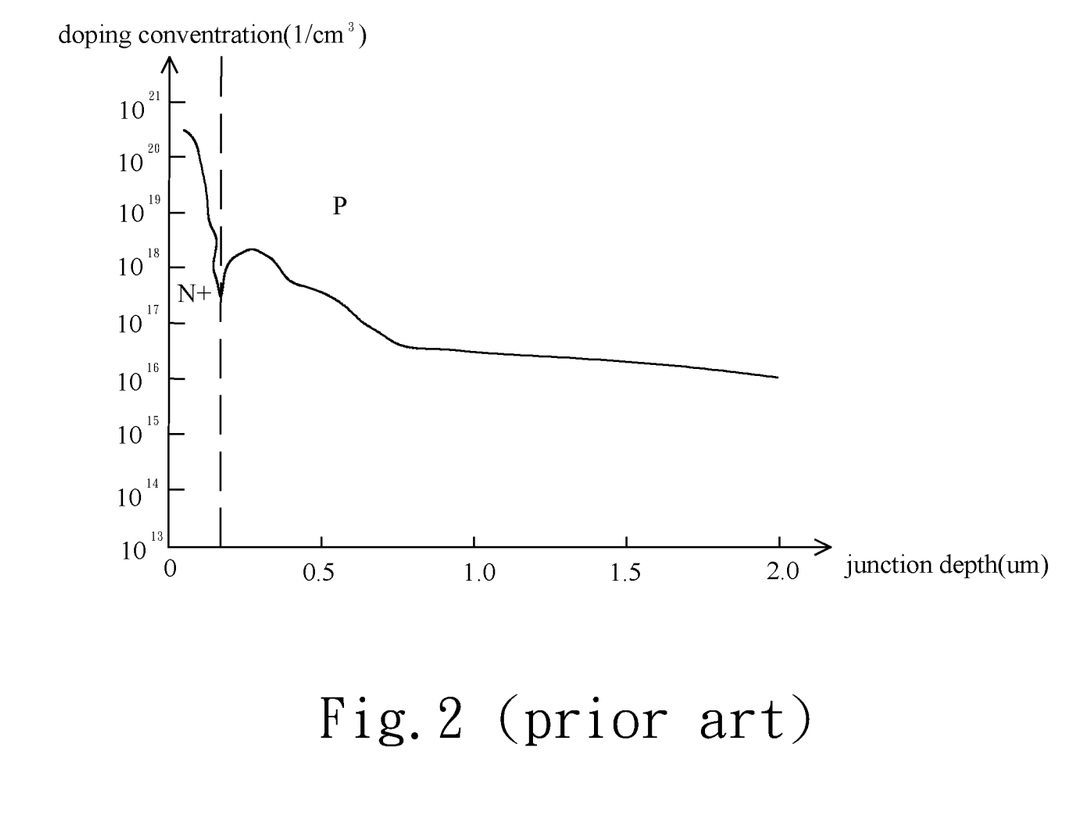
FIG. 2 is a curve of a doping concentration versus a junction depth in the conventional technology.

In U.S. Pat. No. 7,875,933, FIG. 3 shows a semiconductor device that is formed in a semiconductor body. The semiconductor body comprises monocrystalline silicon. For example, the semiconductor body is a p-type substrate. The semiconductor device includes a lateral bipolar transistor formed by two doped regions. The doped regions are of n-type on the p-type substrate. The doped regions are separated by an isolation region, which in the illustrated embodiment is formed by a shallow trench isolation (STI). The doped regions form collector and emitter, respectively. The semiconductor body forms the base. Besides, the body is coupled to a nearby substrate contact. There is an additional implant under the doped region as the collector to tune the breakdown voltage of the collector-to-base junction. In such a case, the breakdown junction is formed between the additional implant and the doped region as the collector. As shown by the dashed line in FIG. 2, the depth of the breakdown junction is 0.1-0.2 um from the surface of the semiconductor body, such that the power dissipation is not well. In addition, the breakdown voltage of the semiconductor device is determined only by dosage of the additional implant. Thus, the adjustable range of the breakdown voltage is narrower.

To overcome the abovementioned problems, the present invention provides a transient voltage suppression device, so as to solve the afore-mentioned problems of the prior art.

SUMMARY OF THE INVENTION

The primary objective of the present invention is to provide a transient voltage suppression device, which forms a buried area under a doped well to form a deeper breakdown junction, thereby improving the power dissipation, and surge and electrostatic discharge (ESD) performance and widening the adjustable range of the breakdown voltage.

To achieve the abovementioned objectives, the present invention provides a transient voltage suppression device, which comprises a lightly-doped semiconductor structure, a first doped well, a first heavily-doped area, a first buried area, and a second heavily-doped area. The lightly-doped semiconductor structure has a first conductivity type. The first doped well has a second conductivity type and is formed in the lightly-doped semiconductor structure. The first heavily-doped area has the second conductivity type and is formed in the first doped well. The first buried area has the first conductivity type and is formed in the lightly-doped semiconductor structure and under the first doped well, and the first buried area is adjacent to the first doped well. The second heavily-doped area has the second conductivity type and is formed in the lightly-doped semiconductor structure.

In an embodiment of the present invention, the lightly-doped semiconductor structure is floating.

In an embodiment of the present invention, the transient voltage suppression device further comprises a second doped well having the second conductivity type and a second buried area having the first conductivity type. The second doped well is formed in the lightly-doped semiconductor structure, and the second heavily-doped area is formed in the second doped well. The second buried area is formed in the lightly-doped semiconductor structure and under the second doped well, and the second buried area is adjacent to the second doped well.

In an embodiment of the present invention, the transient voltage suppression device further comprises a third heavily-doped area having the first conductivity type and formed in the lightly-doped semiconductor structure.

In an embodiment of the present invention, the transient voltage suppression device further comprises at least two isolation structures formed on the lightly-doped semiconductor structure, one of the at least two isolation structures is formed between the second heavily-doped area and the first doped well, and another of the at least two isolation structures is formed between the second heavily-doped area and the third heavily-doped area.

In an embodiment of the present invention, the transient voltage suppression device further comprises at least one isolation structure formed on the lightly-doped semiconductor structure and formed between the first doped well and the second heavily-doped area.

In an embodiment of the present invention, the transient voltage suppression device further comprises at least one isolation structure formed on the lightly-doped semiconductor structure and formed between the first doped well and the second doped well.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 3:
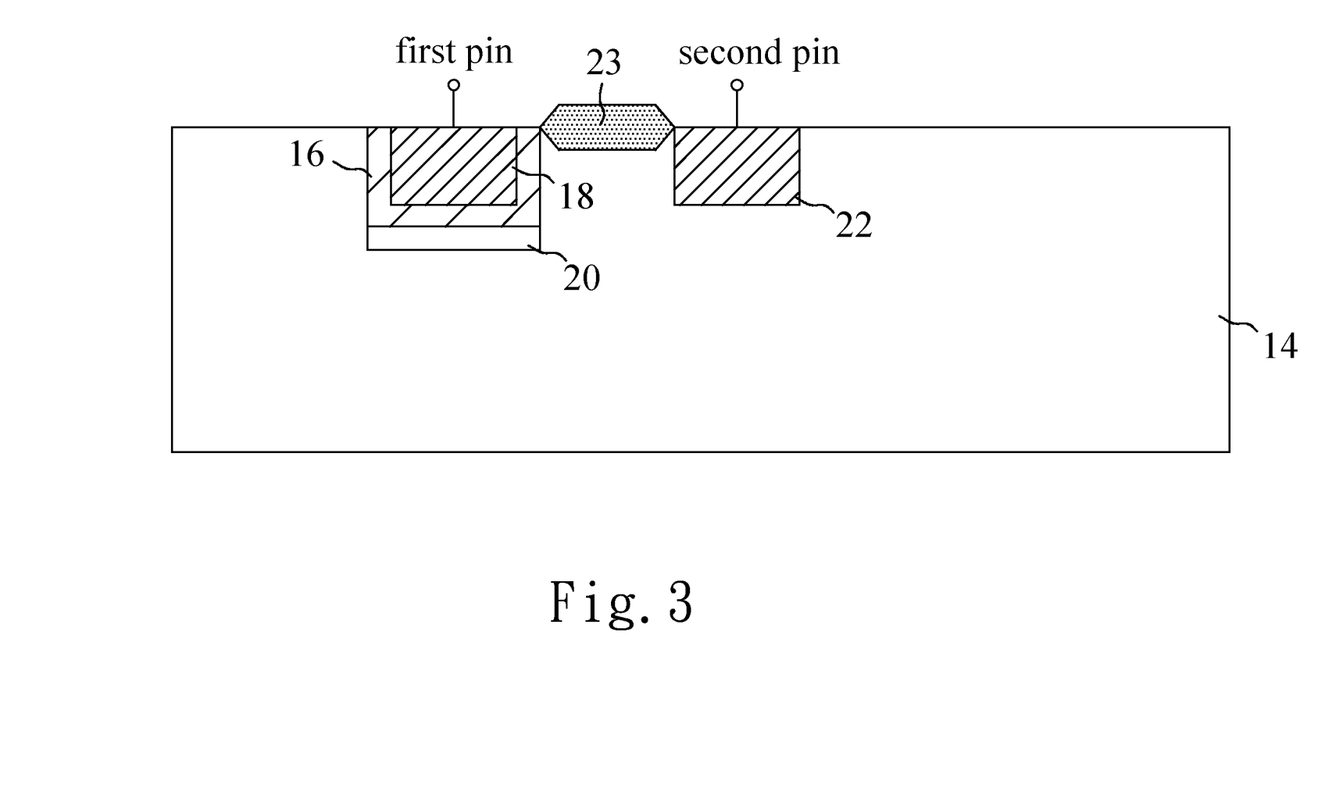
FIG. 3 is a cross-sectional view of a transient voltage suppression device according to the first embodiment of the present invention.

Refer to FIG. 3. The first embodiment of the transient voltage suppression device of the present invention is introduced as follows. The transient voltage suppression device comprises a lightly-doped semiconductor structure 14, a first doped well 16, a first heavily-doped area 18, a first buried area 20, and a second heavily-doped area 22. The lightly-doped semiconductor structure 14 has a first conductivity type. The first doped well 16 has a second conductivity type and is formed in the lightly-doped semiconductor structure 14. The first heavily-doped area 18 has the second conductivity type and is formed in the first doped well 16. The first buried area 20 has the first conductivity type and is formed in the lightly-doped semiconductor structure 14 and under the first doped well 16, and the first buried area 20 is adjacent to the first doped well 16. The second heavily-doped area 22 has the second conductivity type and is formed in the lightly-doped semiconductor structure 14. The lightly-doped semiconductor structure 14 is floating. The first heavily-doped area 18 and the second heavily-doped area 22 are respectively coupled to a first pin and a second pin. In the first embodiment, the lightly-doped semiconductor structure 14 is a lightly-doped semiconductor substrate. Besides, the first conductivity type is a P type and the second conductivity type is an N type. Alternatively, the first conductivity type is an N type and the second conductivity type is a P type.

Alternatively or in combination, the first embodiment of the present invention further comprises at least one isolation structure 23 formed on the lightly-doped semiconductor structure 14 and formed between the first doped well 16 and the second heavily-doped area 22. The isolation structure 23 comprises field oxide or shallow trench isolations.

Figure 4:
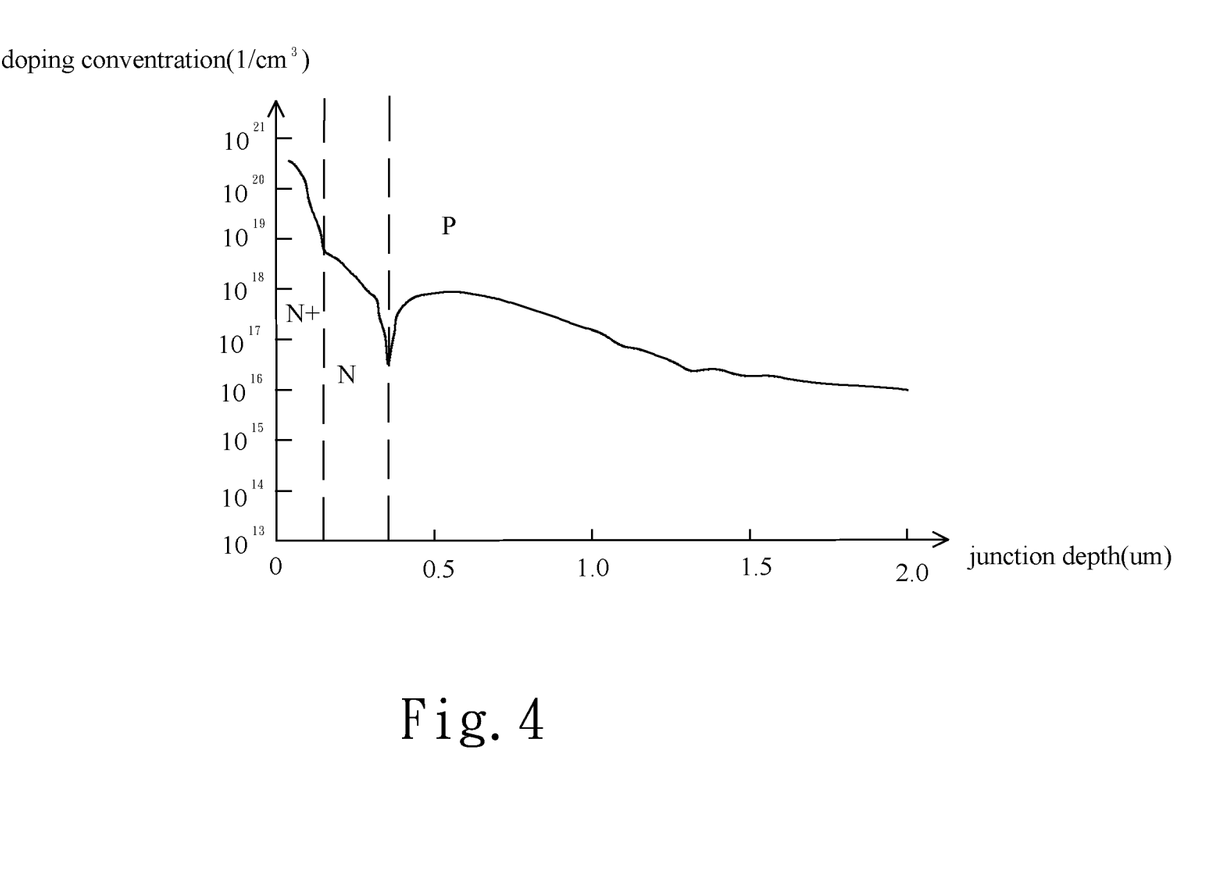
FIG. 4 is a curve of a doping concentration versus a junction depth according to an embodiment of the present invention.

Refer to FIG. 3 and FIG. 4. When the first conductivity type is a P type and the second conductivity type is an N type, the distribution of the doping concentration of the first heavily-doped area 18, the first doped well 16, the first buried area 20, and the lightly-doped semiconductor structure 14 is shown in FIG. 4. As shown in FIG. 4, the depth of the interface between the first heavily-doped area 18 and the first doped well 16 is 0.1-0.2 um from the surface of the lightly-doped semiconductor structure 14. The depth of the breakdown junction between the first doped well 16 and the first buried area 20 is 0.3-0.4 um from the surface of the lightly-doped semiconductor structure 14. As a result, the present invention uses the first buried area 20 to form a deeper breakdown junction, thereby improving the power dissipation, and surge and electrostatic discharge (ESD) performance. In addition, since the breakdown voltage of the breakdown junction is determined by dosages of the first doped well 16 and the first buried area 20, the adjustable range of the breakdown voltage is widened. By the same token, the transient voltage suppression device also improves the power dissipation, and surge and electrostatic discharge (ESD) performance and widens the adjustable range of the breakdown voltage when the first conductivity type is an N type and the second conductivity type is a P type.

Figure 5:
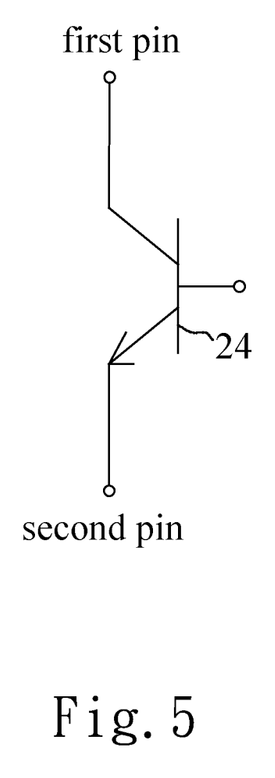
FIG. 5 is a diagram showing an equivalent circuit of FIG. 3.
Figure 6:
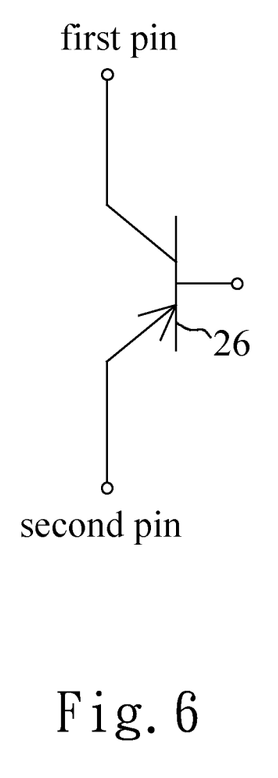
FIG. 6 is a diagram showing another equivalent circuit of FIG. 3.

Refer to FIG. 3 and FIG. 5. When the first conductivity type is a P type and the second conductivity type is an N type, the first heavily-doped area 18, the first doped well 16, the first buried area 20, the lightly-doped semiconductor structure 14, and the second heavily-doped area 22 form an NPN bipolar junction transistor (BJT) 24, wherein the first heavily-doped area 18, the lightly-doped semiconductor structure 14, and the second heavily-doped area 22 are respectively used as the collector, the base, and the emitter of the NPN BJT 24. Refer to FIG. 3 and FIG. 6. When the first conductivity type is an N type and the second conductivity type is a P type, the first heavily-doped area 18, the first doped well 16, the first buried area 20, the lightly-doped semiconductor structure 14, and the second heavily-doped area 22 form a PNP bipolar junction transistor (BJT) 26, wherein the first heavily-doped area 18, the lightly-doped semiconductor structure 14, and the second heavily-doped area 22 are respectively used as the collector, the base, and the emitter of the PNP BJT 26.

Figure 7:
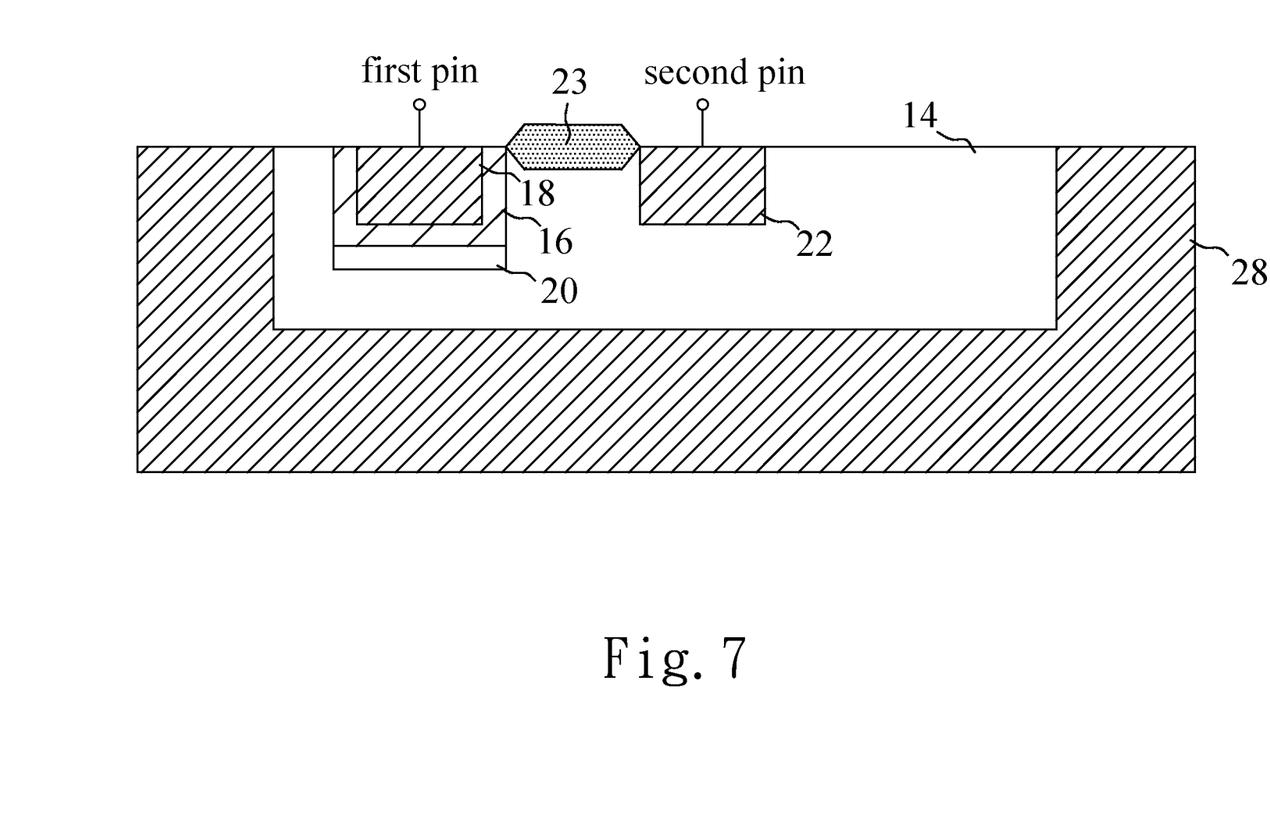
FIG. 7 is a cross-sectional view of a transient voltage suppression device according to the second embodiment of the present invention.

Refer to FIG. 7. The second embodiment of the transient voltage suppression device of the present invention is introduced as follows. The second embodiment is different from the first embodiment in the lightly-doped semiconductor structure 14. In the second embodiment, the transient voltage suppression device further comprises a semiconductor substrate 28 and the lightly-doped semiconductor structure 14 is a lightly-doped well formed in the semiconductor substrate 28. When the first conductivity type is a P type and the second conductivity type is an N type, the semiconductor substrate 28 is an N-type substrate. When the first conductivity type is an N type and the second conductivity type is a P type, the semiconductor substrate 28 is a P-type substrate. The equivalent circuit of the second embodiment is the same to that of the first embodiment so will not be reiterated.

Figure 8:
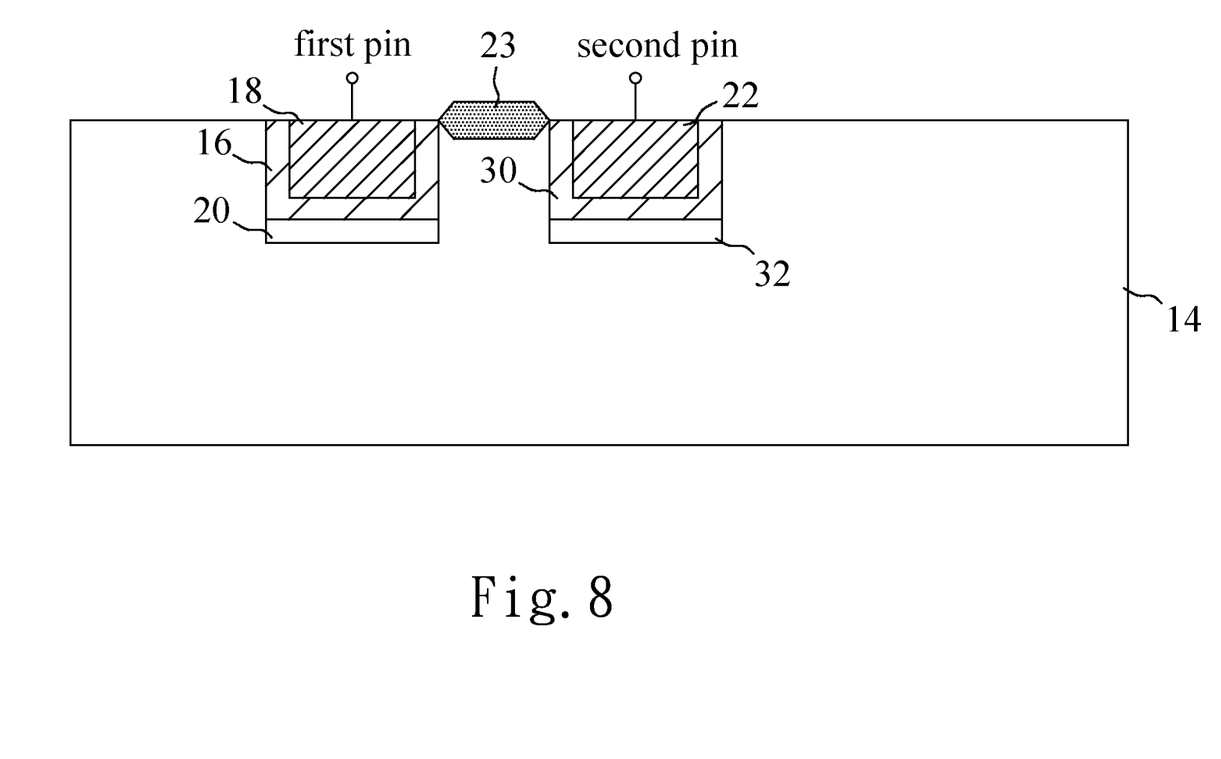
FIG. 8 is a cross-sectional view of a transient voltage suppression device according to the third embodiment of the present invention.

Refer to FIG. 8. The third embodiment of the transient voltage suppression device of the present invention is introduced as follows. The third embodiment is different from the first embodiment in that the third embodiment further comprises a second doped well 30 and a second buried area 32. The third embodiment is a bi-directional transient voltage suppression device. The second doped well 30 has the second conductivity type and is formed in the lightly-doped semiconductor structure 14, and the second heavily-doped area 22 is formed in the second doped well 30. The second buried area 32 has the first conductivity type and is formed in the lightly-doped semiconductor structure 14 and under the second doped well 30, and the second buried area 32 is adjacent to the second doped well 30. The functions of the second doped well 30 and the second buried area 32 are the same to those of the first doped well 16 and the first buried area 20. As a result, the present invention uses the second buried area 32 to form a deeper breakdown junction, thereby improving the power dissipation, and surge and ESD performance. In addition, since the breakdown voltage of the breakdown junction is determined by dosages of the second doped well 30 and the second buried area 32, the adjustable range of the breakdown voltage is widened.

Alternatively or in combination, the third embodiment of the present invention further comprises at least one isolation structure 23 formed on the lightly-doped semiconductor structure 14 and formed between the first doped well 16 and the second doped well 30. The isolation structure 23 comprises field oxide or shallow trench isolations.

Figure 9:
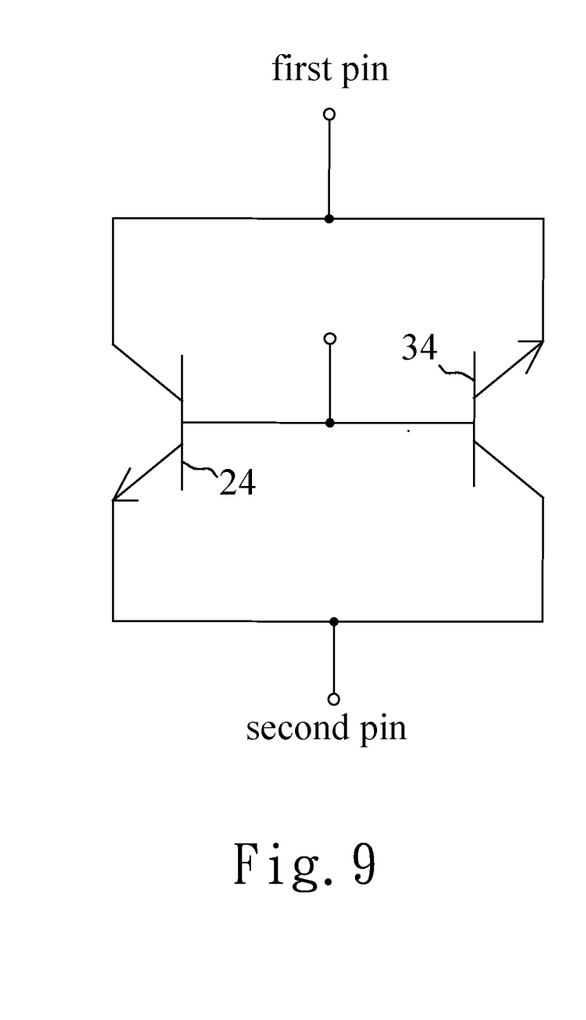
FIG. 9 is a diagram showing an equivalent circuit of FIG. 8.

Refer to FIG. 8 and FIG. 9. When the first conductivity type is a P type and the second conductivity type is an N type, the first heavily-doped area 18, the first doped well 16, the first buried area 20, the lightly-doped semiconductor structure 14, the second doped well 30, the second buried area 32, and the second heavily-doped area 22 form two NPN bipolar junction transistors (BJTs) 24 and 34, wherein the first heavily-doped area 18, the lightly-doped semiconductor structure 14, and the second heavily-doped area 22 are respectively used as the collector, the base, and the emitter of the NPN BJT 24 and the second heavily-doped area 22, the lightly-doped semiconductor structure 14, and the first heavily-doped area 18 are respectively used as the collector, the base, and the emitter of the NPN BJT 34.

Figure 10:
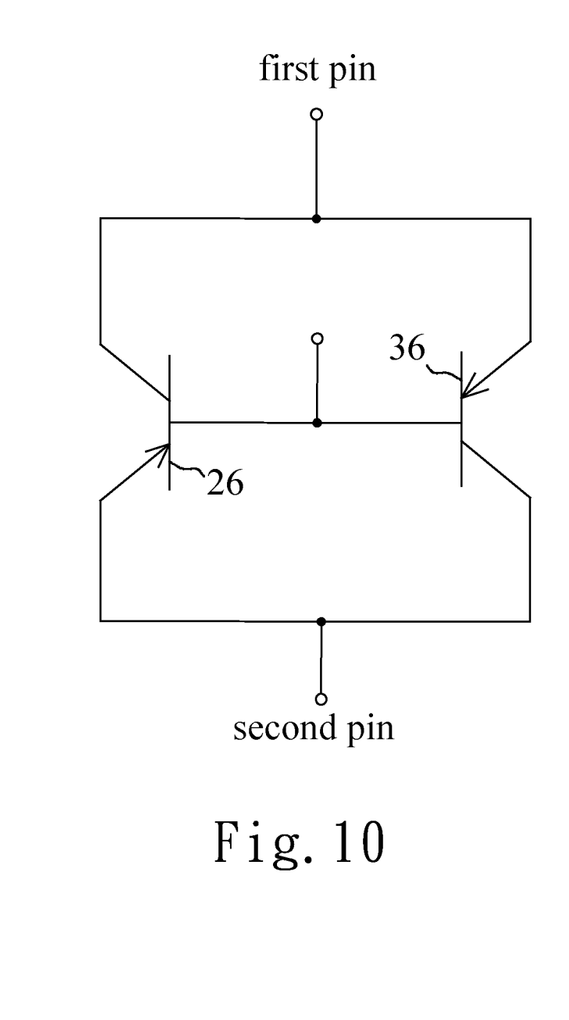
FIG. 10 is a diagram showing another equivalent circuit of FIG. 8.

Refer to FIG. 8 and FIG. 10. When the first conductivity type is an N type and the second conductivity type is a P type, the first heavily-doped area 18, the first doped well 16, the first buried area 20, the lightly-doped semiconductor structure 14, the second doped well 30, the second buried area 32, and the second heavily-doped area 22 form two PNP bipolar junction transistors (BJTs) 26 and 36, wherein the first heavily-doped area 18, the lightly-doped semiconductor structure 14, and the second heavily-doped area 22 are respectively used as the collector, the base, and the emitter of the PNP BJT 26 and the second heavily-doped area 22, the lightly-doped semiconductor structure 14, and the first heavily-doped area 18 are respectively used as the collector, the base, and the emitter of the PNP BJT 36.

Figure 11:
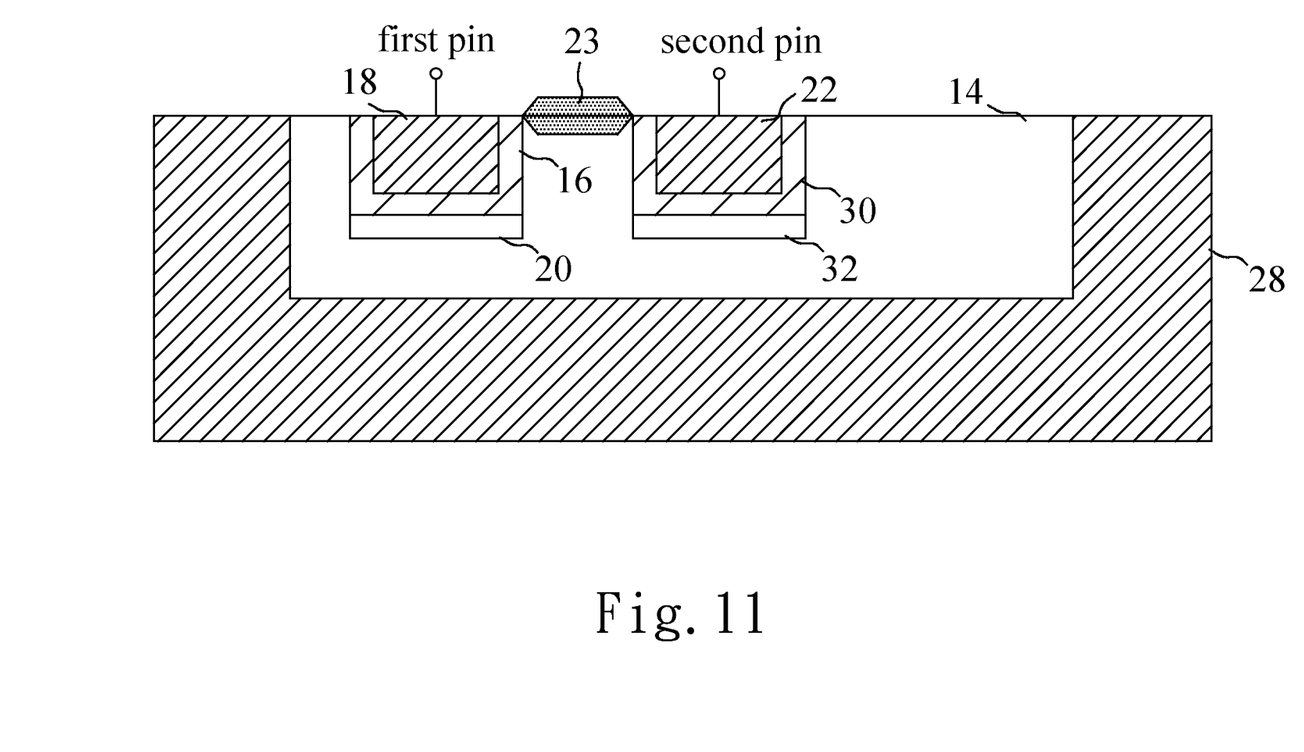
FIG. 11 is a cross-sectional view of a transient voltage suppression device according to the fourth embodiment of the present invention.

Refer to FIG. 11. The fourth embodiment of the transient voltage suppression device of the present invention is introduced as follows. The fourth embodiment is different from the third embodiment in the lightly-doped semiconductor structure 14. In the fourth embodiment, the transient voltage suppression device further comprises a semiconductor substrate 28 and the lightly-doped semiconductor structure 14 is a lightly-doped well formed in the semiconductor substrate 28. When the first conductivity type is a P type and the second conductivity type is an N type, the semiconductor substrate 28 is an N-type substrate. When the first conductivity type is an N type and the second conductivity type is a P type, the semiconductor substrate 28 is a P-type substrate. The equivalent circuit of the fourth embodiment is the same to that of the third embodiment so will not be reiterated.

Figure 12:
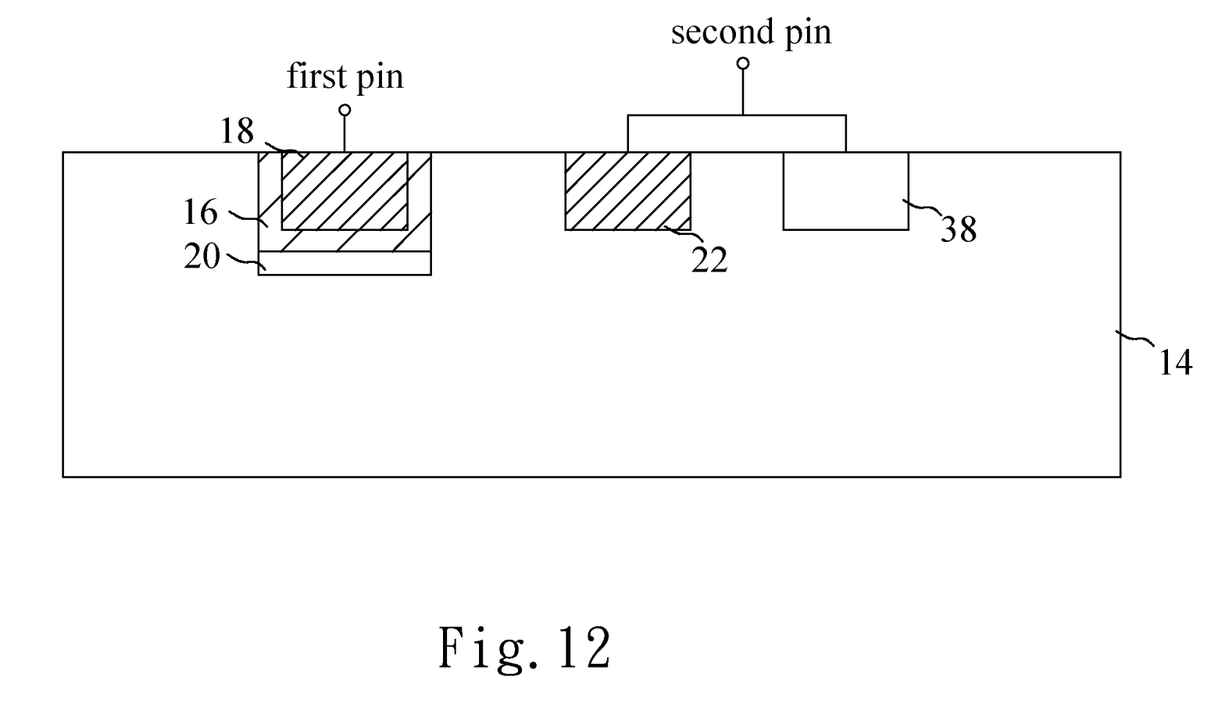
FIG. 12 is a cross-sectional view of a transient voltage suppression device according to the fifth embodiment of the present invention.

Refer to FIG. 12. The fifth embodiment of the transient voltage suppression device of the present invention is introduced as follows. The fifth embodiment is different from the first embodiment in that the fifth embodiment further comprises a third heavily-doped area 38 having the first conductivity type, formed in the lightly-doped semiconductor structure 14, and coupled to the second pin. The fifth embodiment is a uni-directional transient voltage suppression device.

Figure 13:
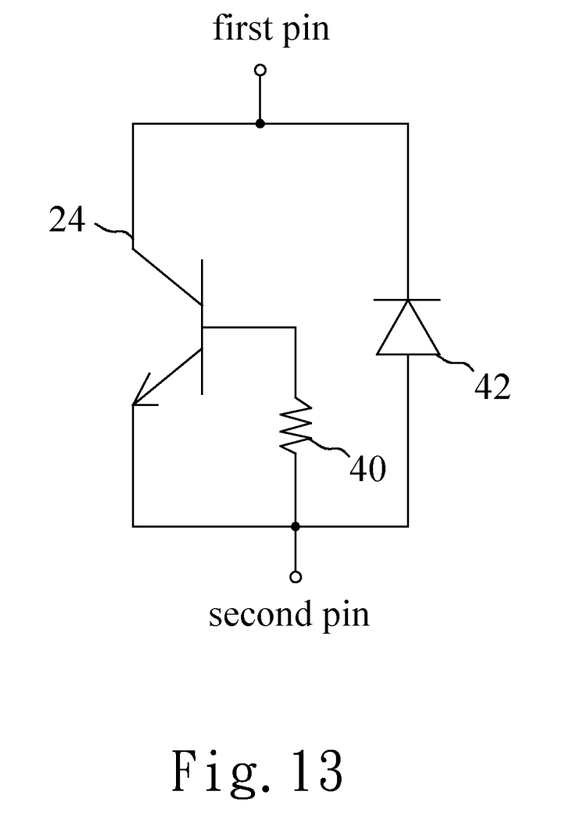
FIG. 13 is a diagram showing an equivalent circuit of FIG. 12.

Refer to FIG. 12 and FIG. 13. When the first conductivity type is a P type and the second conductivity type is an N type, the first heavily-doped area 18, the first doped well 16, the first buried area 20, the lightly-doped semiconductor structure 14, and the second heavily-doped area 22 form an NPN bipolar junction transistor (BJT) 24, wherein the first heavily-doped area 18, the lightly-doped semiconductor structure 14, and the second heavily-doped area 22 are respectively used as the collector, the base, and the emitter of the NPN BJT 24. Besides, the lightly-doped semiconductor structure 14 forms a resistor 40, and the first heavily-doped area 18, the first doped well 16, the first buried area 20, the lightly-doped semiconductor structure 14, and the third heavily-doped area 38 form a diode 42.

Figure 14:
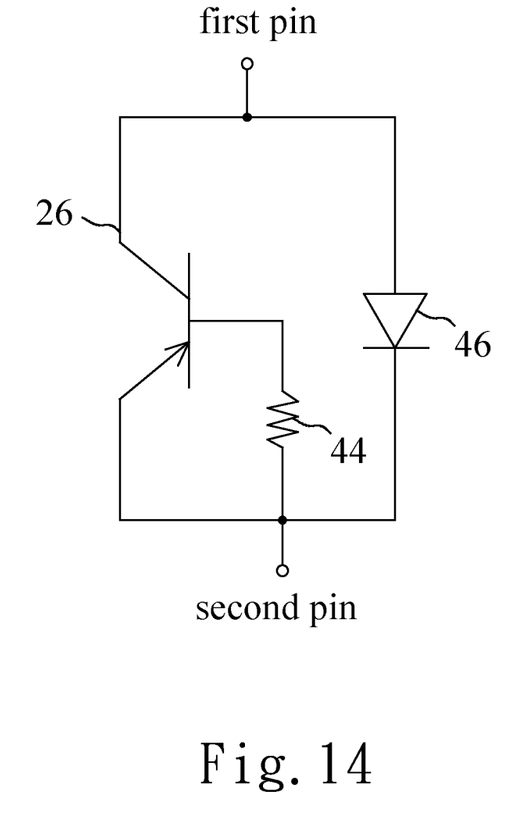
FIG. 14 is a diagram showing another equivalent circuit of FIG. 12.

Refer to FIG. 12 and FIG. 14. When the first conductivity type is an N type and the second conductivity type is a P type, the first heavily-doped area 18, the first doped well 16, the first buried area 20, the lightly-doped semiconductor structure 14, and the second heavily-doped area 22 form a PNP bipolar junction transistor (BJT) 26, wherein the first heavily-doped area 18, the lightly-doped semiconductor structure 14, and the second heavily-doped area 22 are respectively used as the collector, the base, and the emitter of the PNP BJT 26. Besides, the lightly-doped semiconductor structure 14 forms a resistor 44, and the first heavily-doped area 18, the first doped well 16, the first buried area 20, the lightly-doped semiconductor structure 14, and the third heavily-doped area 38 form a diode 46.

Figure 15:
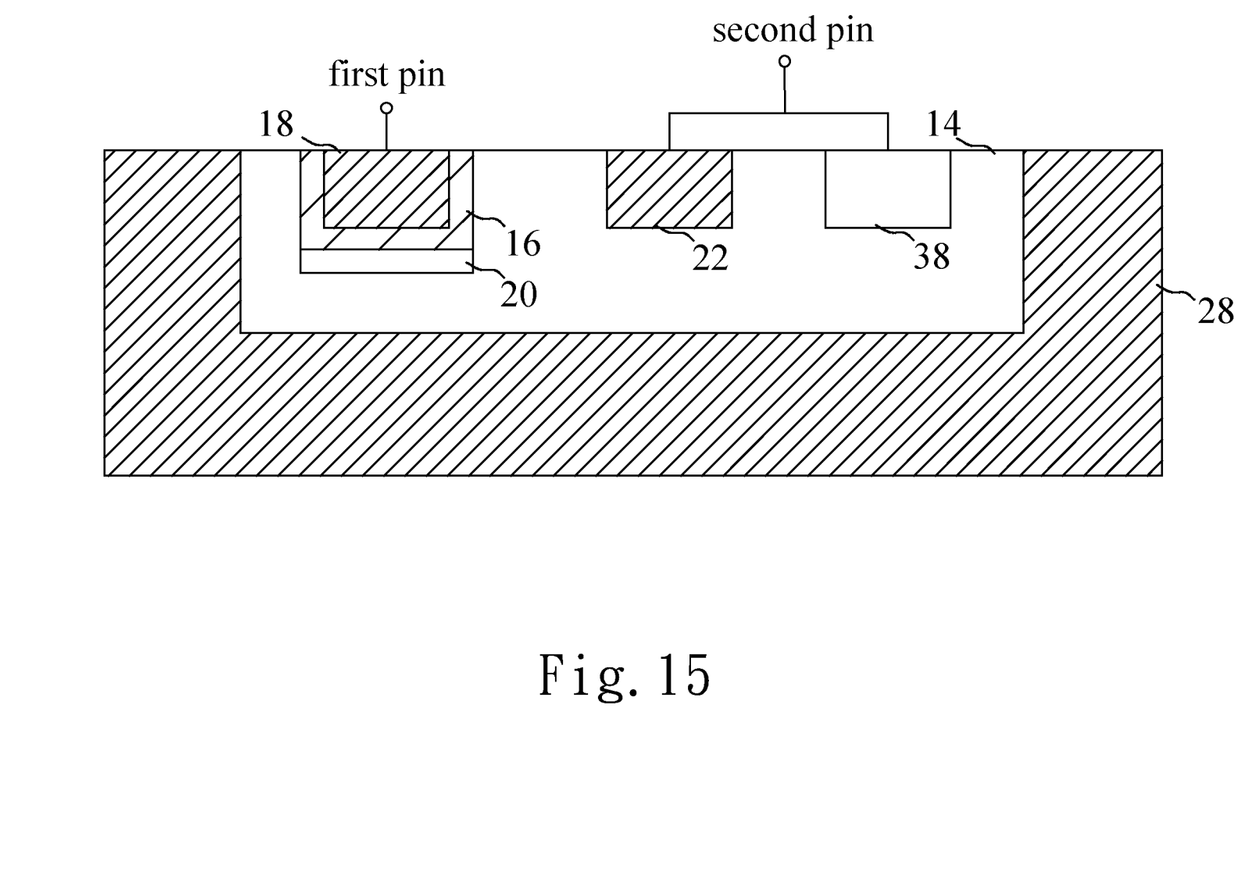
FIG. 15 is a cross-sectional view of a transient voltage suppression device according to the sixth embodiment of the present invention.

Refer to FIG. 15. The sixth embodiment of the transient voltage suppression device of the present invention is introduced as follows. The sixth embodiment is different from the fifth embodiment in the lightly-doped semiconductor structure 14. In the sixth embodiment, the transient voltage suppression device further comprises a semiconductor substrate 28 and the lightly-doped semiconductor structure 14 is a lightly-doped well formed in the semiconductor substrate 28. When the first conductivity type is a P type and the second conductivity type is an N type, the semiconductor substrate 28 is an N-type substrate. When the first conductivity type is an N type and the second conductivity type is a P type, the semiconductor substrate 28 is a P-type substrate. The equivalent circuit of the sixth embodiment is the same to that of the fifth embodiment so will not be reiterated.

Figure 16:
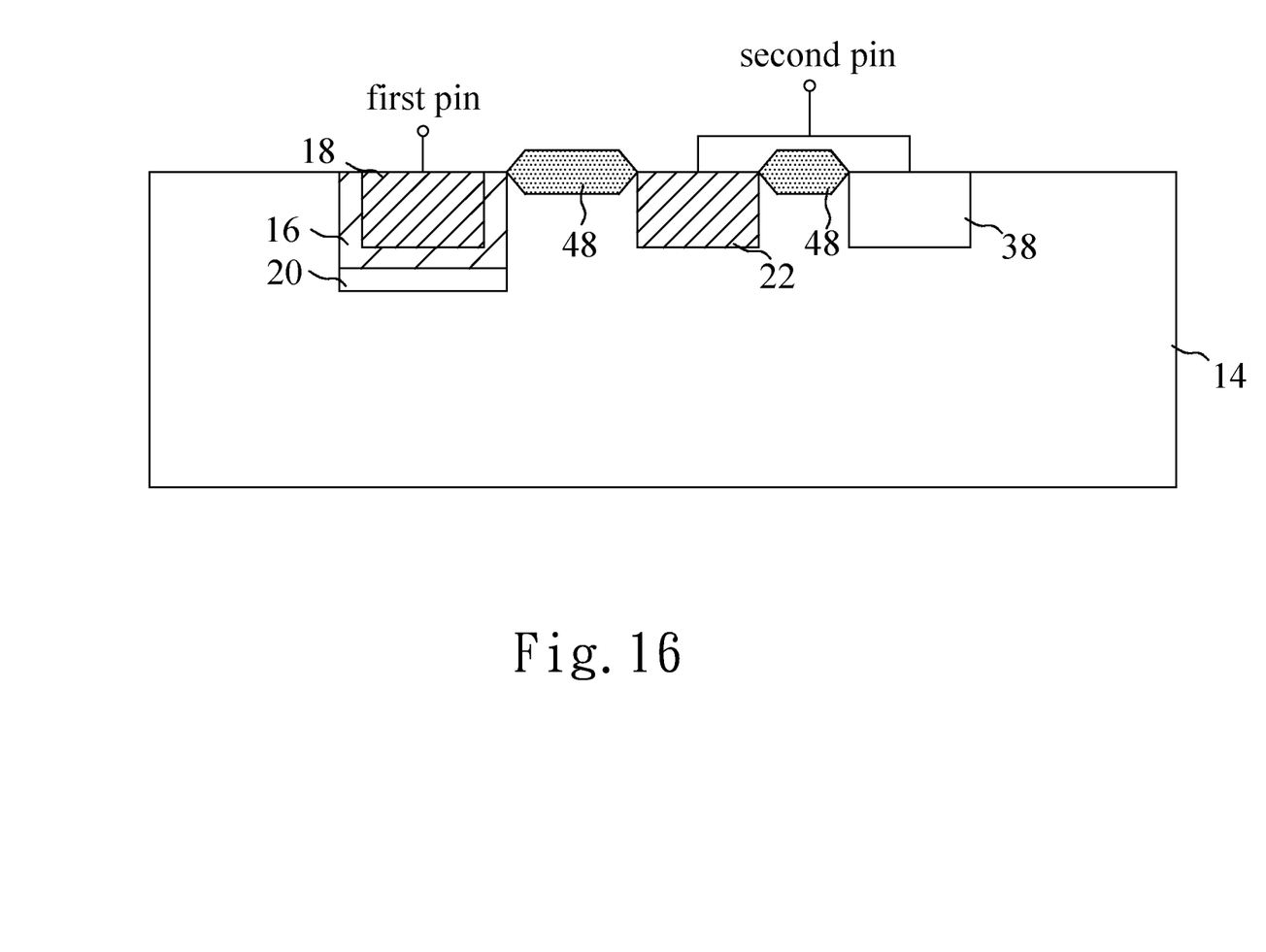
FIG. 16 is a cross-sectional view of a transient voltage suppression device according to the seventh embodiment of the present invention.

Refer to FIG. 16. The seventh embodiment of the transient voltage suppression device of the present invention is introduced as follows. The seventh embodiment is different from the fifth embodiment in that the seventh embodiment further comprises at least two isolation structures 48 formed on the lightly-doped semiconductor structure 14. The isolation structures 48 comprise field oxide or shallow trench isolations. One of the isolation structures 48 is formed between the second heavily-doped area 22 and the first doped well 16, and another of the isolation structures 48 is formed between the second heavily-doped area 22 and the third heavily-doped area 38. The seventh embodiment is a unidirectional transient voltage suppression device in a complementary metal-oxide-semiconductor (CMOS) process. The equivalent circuit of the seventh embodiment is the same to that of the fifth embodiment so will not be reiterated.

Figure 17:
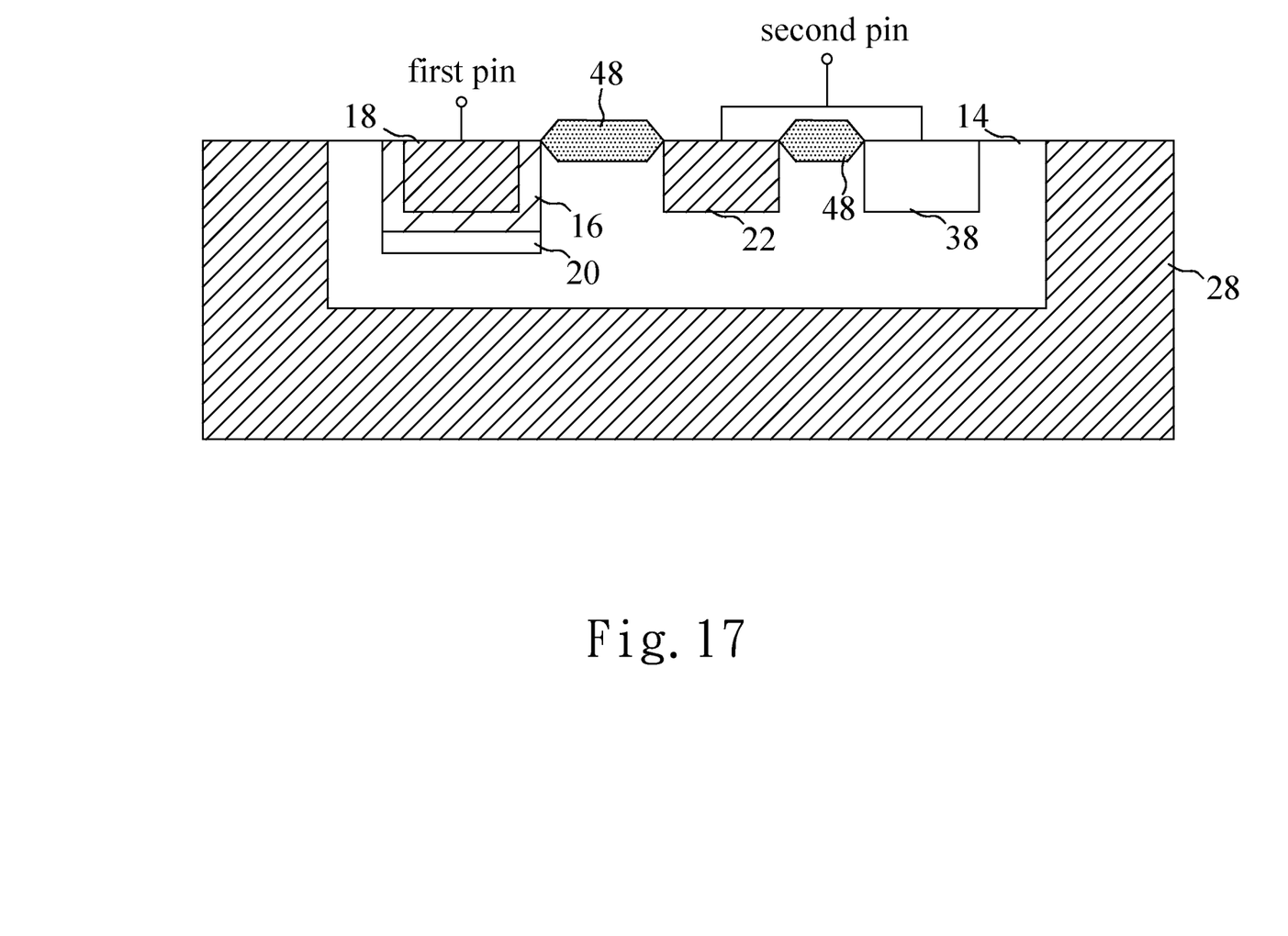
FIG. 17 is a cross-sectional view of a transient voltage suppression device according to the eighth embodiment of the present invention.

Refer to FIG. 17. The eighth embodiment of the transient voltage suppression device of the present invention is introduced as follows. The eighth embodiment is different from the seventh embodiment in the lightly-doped semiconductor structure 14. In the eighth embodiment, the transient voltage suppression device further comprises a semiconductor substrate 28 and the lightly-doped semiconductor structure 14 is a lightly-doped well formed in the semiconductor substrate 28. When the first conductivity type is a P type and the second conductivity type is an N type, the semiconductor substrate 28 is an N-type substrate. When the first conductivity type is an N type and the second conductivity type is a P type, the semiconductor substrate 28 is a P-type substrate. The equivalent circuit of the eighth embodiment is the same to that of the seventh embodiment so will not be reiterated.

In conclusion, the present invention forms a buried area under a doped well to form a deeper breakdown junction, thereby improving the power dissipation, and surge and ESD performance and widening the adjustable range of the breakdown voltage.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A transient voltage suppression device comprising:
    a lightly-doped semiconductor structure having a first conductivity type;
    a first doped well, having a second conductivity type, formed in the lightly-doped semiconductor structure;
    a first heavily-doped area, having the second conductivity type, formed in the first doped well;
    a first buried area, having the first conductivity type, formed in the lightly-doped semiconductor structure and under the first doped well, wherein the first buried area contacts the first doped well, there is nothing between the first buried area and the first doped well, and the first buried area and the first doped well form a breakdown interface; and
    a second heavily-doped area, having the second conductivity type, formed in the lightly-doped semiconductor structure;
    at least one isolation structure formed in the lightly-doped semiconductor structure and formed between the first doped well and the second heavily-doped area, wherein a depth of the at least one isolation structure is shallower than a depth of the first doped well;
    wherein the first conductivity type is opposite to the second conductivity type;
    wherein the lightly-doped semiconductor structure, the first doped well, the first heavily-doped area, the first buried area, and the second heavily-doped area form a bipolar junction transistor, the first doped well and the first heavily-doped area are used as a collector of the bipolar junction transistor, the first buried area and the lightly-doped semiconductor structure are used as a base of the bipolar junction transistor, and the second heavily-doped area is used as an emitter of the bipolar junction transistor;
    wherein the first heavily-doped area and the second heavily-doped area are respectively coupled to a first pin and a second pin.

2. The transient voltage suppression device according to claim 1, wherein the first conductivity type is an N type and the second conductivity type is a P type.

3. The transient voltage suppression device according to claim 2, further comprising a P-type substrate, and the lightly-doped semiconductor structure is a lightly-doped well formed in the P-type substrate.

4. The transient voltage suppression device according to claim 2, wherein the lightly-doped semiconductor structure is a lightly-doped semiconductor substrate.

5. The transient voltage suppression device according to claim 1, wherein the first conductivity type is a P type and the second conductivity type is an N type.

6. The transient voltage suppression device according to claim 5, further comprising an N-type substrate, and the lightly-doped semiconductor structure is a lightly-doped well formed in the N-type substrate.

7. The transient voltage suppression device according to claim 5, wherein the lightly-doped semiconductor structure is a lightly-doped semiconductor substrate.

8. The transient voltage suppression device according to claim 1, wherein the lightly-doped semiconductor structure is floating.

9. The transient voltage suppression device according to claim 1, further comprising a third heavily-doped area having the first conductivity type, and the third heavily-doped area is formed in the lightly-doped semiconductor structure.

10. The transient voltage suppression device according to claim 9, wherein the second pin is coupled to the third heavily-doped area.

11. The transient voltage suppression device according to claim 1, wherein the at least one isolation structure comprises field oxide or shallow trench isolations.

* * * * *